US011424550B2

(12) United States Patent
Virtanen

(10) Patent No.: US 11,424,550 B2
(45) Date of Patent: Aug. 23, 2022

(54) ELECTROMAGNETIC-WAVE ABSORBER AND METHOD

(71) Applicants: Timo Virtanen, Vuohijärvi (FI); Lainisalo Capital OU, Tallinn (EE)

(72) Inventor: Timo Virtanen, Vuohijärvi (FI)

(73) Assignees: Timo Virtanen, Vuohijärvi (FI); Lainisalo Capital OU, Tallinn (EE)

( * ) Notice: Subject to any disclaimer, the term of this patent is extended or adjusted under 35 U.S.C. 154(b) by 234 days.

(21) Appl. No.: 16/628,296

(22) PCT Filed: Jul. 3, 2018

(86) PCT No.: PCT/FI2018/050530
§ 371 (c)(1),
(2) Date: Jan. 3, 2020

(87) PCT Pub. No.: WO2019/008231
PCT Pub. Date: Jan. 10, 2019

(65) Prior Publication Data
US 2020/0220274 A1    Jul. 9, 2020

(30) Foreign Application Priority Data

Jul. 6, 2017  (FI) ..................................... 20175660

(51) Int. Cl.
*H05K 9/00* (2006.01)
*H01Q 17/00* (2006.01)
*F41H 3/00* (2006.01)

(52) U.S. Cl.
CPC .......... *H01Q 17/00* (2013.01); *H05K 9/0088* (2013.01); *F41H 3/00* (2013.01)

(58) Field of Classification Search
CPC .................................................. H05K 9/0088
See application file for complete search history.

(56) References Cited

U.S. PATENT DOCUMENTS 5,047,283 A * 9/1991 Leatherman ......... H05K 9/0092
428/209
5,185,381 A    2/1993 Ruffoni
(Continued)

FOREIGN PATENT DOCUMENTS

EP    0479438 A2    4/1992
EP    1272024 A1    1/2003
(Continued)

OTHER PUBLICATIONS

Extended European Search Report for corresponding European patent application No. 18828786.6 dated Mar. 2, 2021 (eight pages).
(Continued)

*Primary Examiner* — Hung V Ngo
(74) *Attorney, Agent, or Firm* — Harness, Dickey & Pierce, P.L.C.

(57) ABSTRACT

An electromagnetic-wave absorber having a body of porous material, including a first surface for receiving electromagnetic waves is described. Starting from the first surface, a first layer for scattering the electromagnetic waves includes pores which are coated with electrically conductive material. The electromagnetic-wave absorber also includes a second layer positioned after the first layer which is substantially transparent to the electromagnetic waves.

10 Claims, 8 Drawing Sheets

(56) References Cited

U.S. PATENT DOCUMENTS 5,561,428 A   10/1996  Czaja et al.
2014/0111365 A1*  4/2014  Liu .......................... A61N 1/16
                                                                342/4

FOREIGN PATENT DOCUMENTS

JP          2001320190 A     11/2001
JP          2007095830 A      4/2007

OTHER PUBLICATIONS

International Search Report and Written Opinion of the International Search Authority issued in PCT/FI2018/050530, dated Nov. 5, 2018; ISA/FI.

* cited by examiner

ELECTROMAGNETIC-WAVE ABSORBER AND METHOD

CROSS REFERENCE TO RELATED APPLICATIONS

This application is a U.S. National Phase under 35 U.S.C. 371 of International Application No. PCT/FI2018/050530, filed Jul. 3, 2018, and published as WO 2019/008231A1 on Jan. 10, 2019. This application is based on and claims priority to Finland Application No. 20175660 filed Jul. 6, 2017. The entire disclosures of the above applications are incorporated herein by reference.

FIELD

The present disclosure relates to absorbing electromagnetic waves. In particular, the disclosure relates to producing a stealth cover.

BACKGROUND

Electromagnetic waves are used in military and civilian applications for target detection. Examples of such technologies include radars, laser range finding, thermal imaging and active-illumination night vision. To provide cover for targets subjected to these detection technologies, various methods have been developed including shaping targets in such a way as to reduce their appearance in the detection devices. Alternatively or in addition, the targets may also be covered by different kinds of absorption materials. Such stealth covers may also be used to protect from environmental electromagnetic fields even when such fields are not specifically generated for target detection.

Due to different types of targets and protection requirements, the variety of covering methods is large. For example, the targets may be fixed installations or moving targets such as vehicles or personnel and the protection requirements may involve requirements for the type of electromagnetic radiation to be hidden from, the ease of use, manufacture or assembly and finally the cost of such measures. Many of the current stealth materials have to compromise with respect of one or more of these requirements, whereas the scope of use for these materials varies from manufacturing high-tech products such as modern fighter jets to grass root level field operations, where different advantages are emphasized.

There remains demand for new types of stealth materials that may fulfil one or more of the above requirements.

OBJECTIVE

An objective is to eliminate at least some of the drawbacks of the prior art referred to above. In particular, an objective is to disclose an electromagnetic-wave absorber. A further objective is to disclose a method according to which an electromagnetic-wave absorber may be provided.

SUMMARY

An electromagnetic-wave absorber is disclosed and hereinafter referred to as the "absorber". Unless specified otherwise, "electromagnetic waves" refer to the frequency range of the absorber, which is a subset of the whole electromagnetic spectrum.

The absorber comprises a body of porous material which may be placed on a reflective surface so that the reflection of electromagnetic radiation directed on the absorber may be notably reduced. When a target to be protected by the absorber comprises a reflective shell such as a metallic shell, the absorber may be placed directly on the target to reduce reflection. On the other hand, the absorber may also include an integrated reflector such as a metallic body so that the absorber may be used also with non-reflective targets. The absorber may further be integrated with additional covers neutral or substantially neutral to the wave lengths to be absorbed but which provide, for example, visual camouflage.

The absorber exploits three features. The first is porous structure of the body providing randomly oriented surfaces within the absorber. The second is a coating of electrically conductive material applied within the absorber which allows the randomly oriented surfaces to function as reflective surfaces for the electromagnetic waves trapped in the absorbing material. The coating is applied to cover the porous material structure at least partially within a layer in the body of porous material. The third is a neutral layer formed in the absorber, the neutral layer being a layer transparent or substantially transparent to the electromagnetic waves. The neutral layer may be formed in the body of porous material when the thickness of the layer comprising coating is limited below the total thickness of the body. In this case, the absorber comprises a monolithic absorbing body, which may consist of only two layers: a layer comprising coating and a layer free of coating. Alternatively, separate material bodies may be used to form the neutral layer. In either case, the order of the layers is such that the layer comprising coating (hereinafter also "the coated layer") is positioned between the surface on which the electromagnetic waves are incident and the neutral layer.

According to a first aspect, an electromagnetic-wave absorber comprises a body of porous material. The body of porous material further comprises a first surface for receiving electromagnetic waves and, starting from the first surface, a first layer for scattering the electromagnetic waves, in which layer pores comprise a coating of electrically conductive material. The electromagnetic-wave absorber further comprises, positioned after the first layer, a second layer substantially transparent to the electromagnetic waves. The electromagnetic absorber provides various effects. It may be constructed as a single piece. It may also be removably attached to a target. The use of porous material allows the absorber to be manufactured light-weighted and resource-efficiently. The range of absorbed frequencies may also be controlled. The absorber structure allows various physical processes which may take part inside the absorbing body and improve the performance of the absorber. These may include chaotic scattering inside the porous structure comprising reflective coating, resistive dissipation of energy and capacitive dissipation. As the invention has been made in an unexpected process, there remains possibility for further physical processes taking part in producing the effects of the invention at different absorbing frequencies. It is noted that the absorber can be manufactured relatively easily in comparison with many other absorbers and using materials that are typically readily available. In addition, the frequency ranges for the electromagnetic radiation absorbed by the absorber may be flexibly controlled by changing at least one of the thickness of the first layer, the thickness of the second layer or the properties of the porous material such as porosity.

In an embodiment, the electromagnetic-wave absorber comprises, positioned after the second layer, a reflective surface for reflecting the electromagnetic waves. Consequently, the neutral layer is then positioned between the first layer and the reflective surface. This allows the absorber to be used also with non-reflective targets. This way, the absorber may be provided as a stand-alone element. In a further embodiment, the reflective surface is a metallic film. This allows, for example, reduction in the size of the absorber. A metallic reflector may provide also thermal reflectivity and function as a thermal shield or a physical fire prevention body.

In an embodiment, the second layer is formed in the body of porous material. This allows the absorber to be manufactured as a single monolithic body so that the layers do not need to be separately attached improving, for example, reliability of the absorber under demanding conditions.

In an embodiment, the porous material is open-porous material. This allows the coating to easily permeate the body of porous material. Additionally, open-porous materials have many randomly-oriented surfaces suitable for scattering when coated with reflective material. The structure in general is suitable for producing electromagnetic scattering and dissipation in various ways.

In an embodiment, the porous material has a porosity of at least 90 percent. This allows the coating to easily permeate the body of porous material. Additionally, this reduces the weight of the absorber.

In an embodiment, the porous material has 15-60 pores per inch (PPI). The value may directly affect the amount of reflection.

In an embodiment, the coating only partially covers the pores so that a region with coating is formed on the side of the pores facing the first surface and a region free of coating is formed on the side of the pores facing away from the first surface. Due to the structure porous materials, this allows pockets to be formed inside the absorbing body, where scattering in the direction of the incident electromagnetic radiation is preferred. Consequently, reflection in the direction of the incident radiation is reduced.

In an embodiment, the thickness of the first layer is 70-85 percent of the combined thickness of the first layer and the second layer. The value may directly affect the amount of reflection.

In an embodiment, the electrically conductive material is metal, metal alloy or carbon-based material. These allow producing a thin coating with high reflection.

In an embodiment, the electromagnetic-wave absorber comprises at least one cover of material substantially transparent to the electromagnetic waves covering at least the first surface. This allows the absorber to provide additional protection for the target, for example visual camouflage. It also allows to protect the absorber itself or to package the absorber in particular in case it includes several bodies or layers.

According to a second aspect, a method comprises coating pores within a body of porous material with electrically conductive material to form a first layer within the body for scattering electromagnetic waves. In this way, multiple randomly-oriented scattering interfaces may be formed in the porous material to produce an absorber for electromagnetic waves.

In an embodiment, the coating of the pores is performed by spraying or squirting a first surface of the body with electrically conductive material. This allows one direction to be spatially preferred so in coating so that the coating formed within the material is predominantly oriented towards the first surface. By spraying or squirting, the coating may be applied in the body quickly and easily. The depth of the layer may be controlled, for example, by the pressure of spraying or squirting.

In an embodiment, the method comprises coupling the body to a reflective surface so that between the first layer and the reflective surface, a second layer substantially transparent to the electromagnetic waves is formed. This allows creation of a neutral layer for scattering, which neutral layer may be formed within the body of porous material or in another piece of material between the body and the reflective surface.

In an embodiment, the method comprises attaching the body to a target by covering it with a polymer compound. This allows the body to be attached to a target quickly and easily, while at the same time providing a protective cover for the body.

It is to be understood that the aspects and embodiments of the invention described above may be used in any combination with each other. Several of the aspects and embodiments may be combined together to form a further embodiment of the invention.

It is specifically to be understood that the method according to the second aspect may be used to provide an electromagnetic-wave absorber according to the first aspect and any number of embodiments described in relation to the first aspect.

LIST OF FIGURES

The accompanying drawings, which are included to provide a further understanding of the invention and constitute a part of this specification, illustrate embodiments of the invention and together with the description help to explain the principles of the invention. In the drawings.

Figure 5:
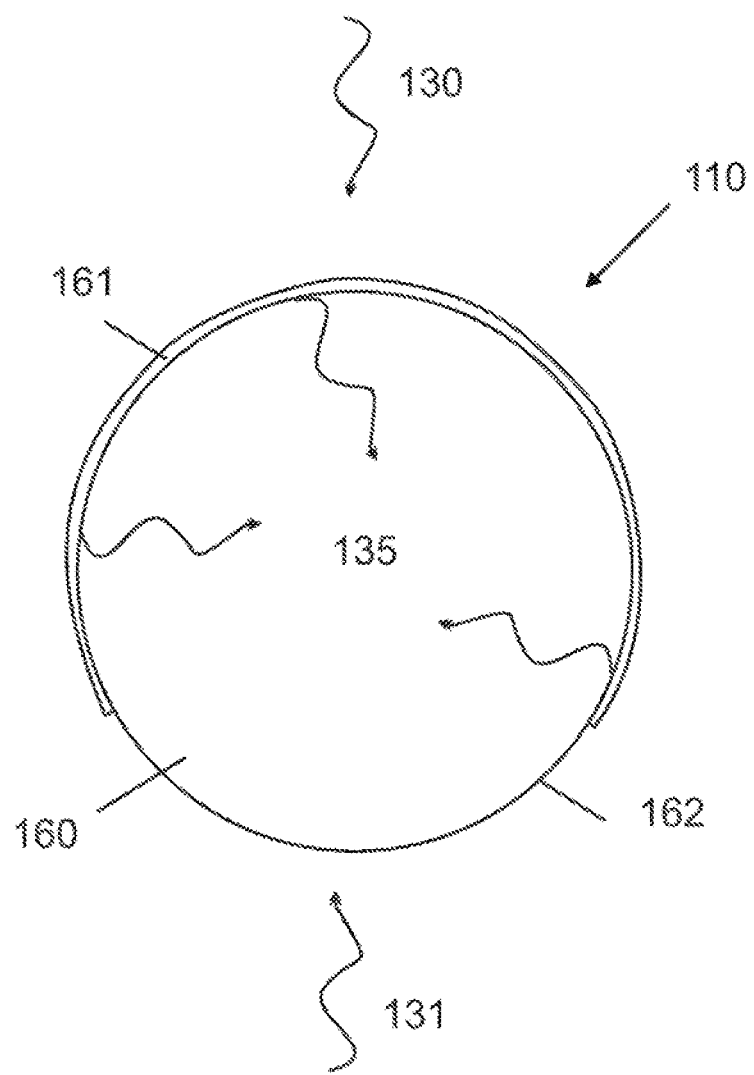

FIG. 5 further illustrates an inner structure of a body of an electromagnetic-wave absorber according to an embodiment.

Figure 6:
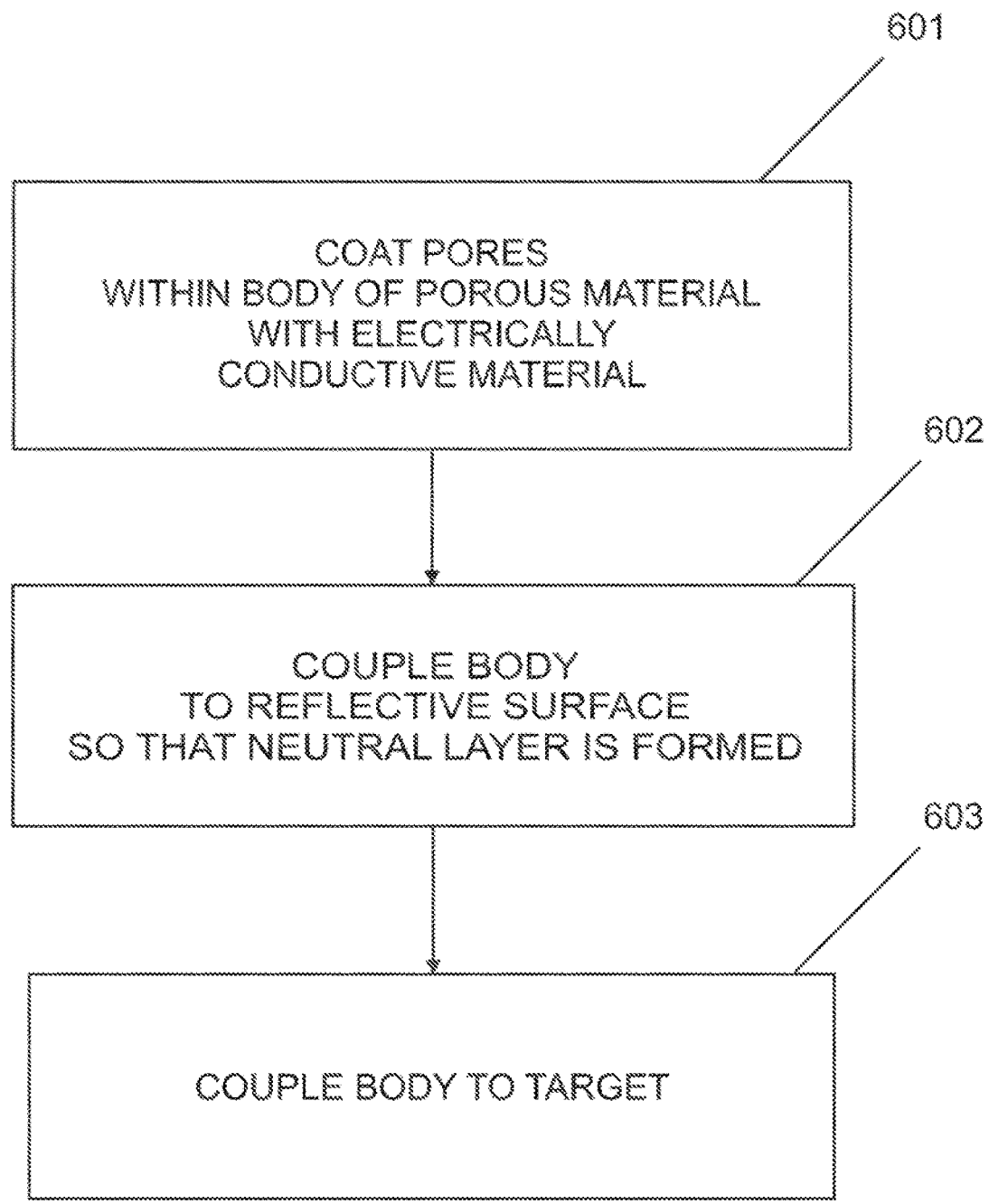

FIG. 6 illustrates a flow chart of a method according to an embodiment.

Figure 7A:
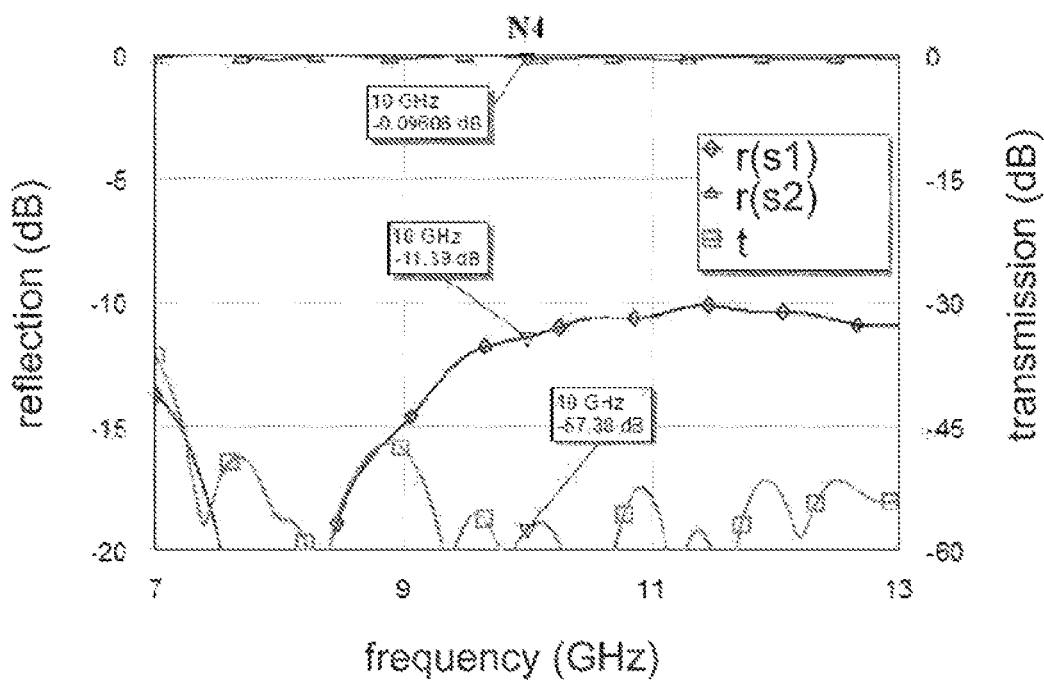
Figure 7B:
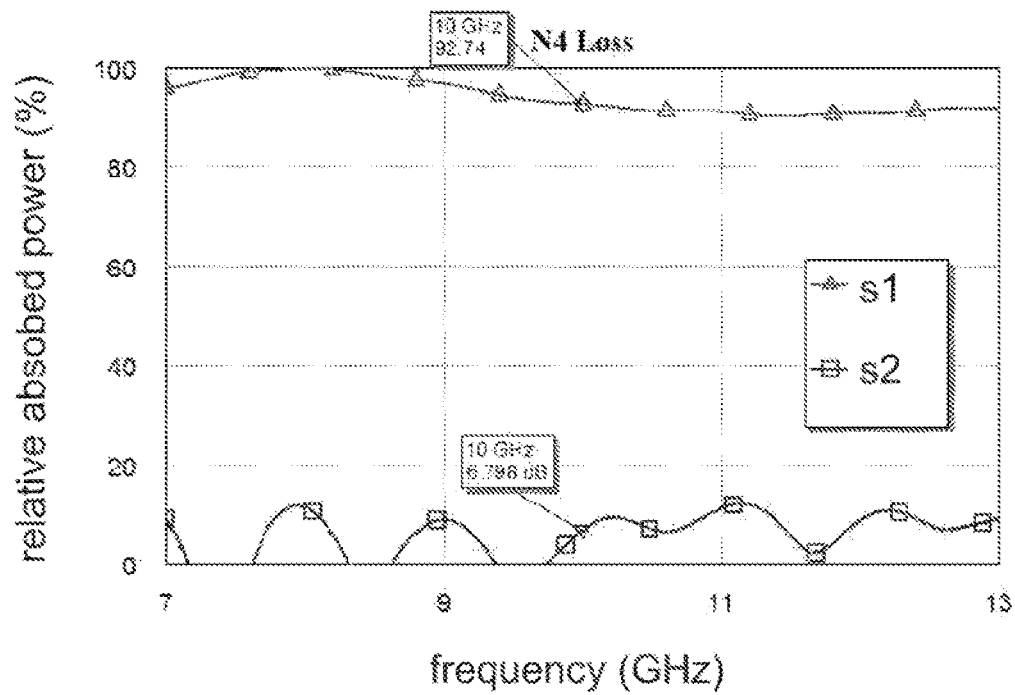

FIGS. 7a-b illustrate measurement results related to an electromagnetic-wave absorber according to an embodiment. FIG. 7a illustrates reflection and transmission measurements and FIG. 7b illustrates measurements for absorbed power.

Like references are used to designate like parts in the accompanying drawings.

DETAILED DESCRIPTION

The detailed description provided below in connection with the appended drawings is intended as a description of the embodiments and is not intended to represent the only forms in which the embodiment may be constructed or utilized. However, the same or equivalent functions and structures may be accomplished by different embodiments.

Figure 1A:
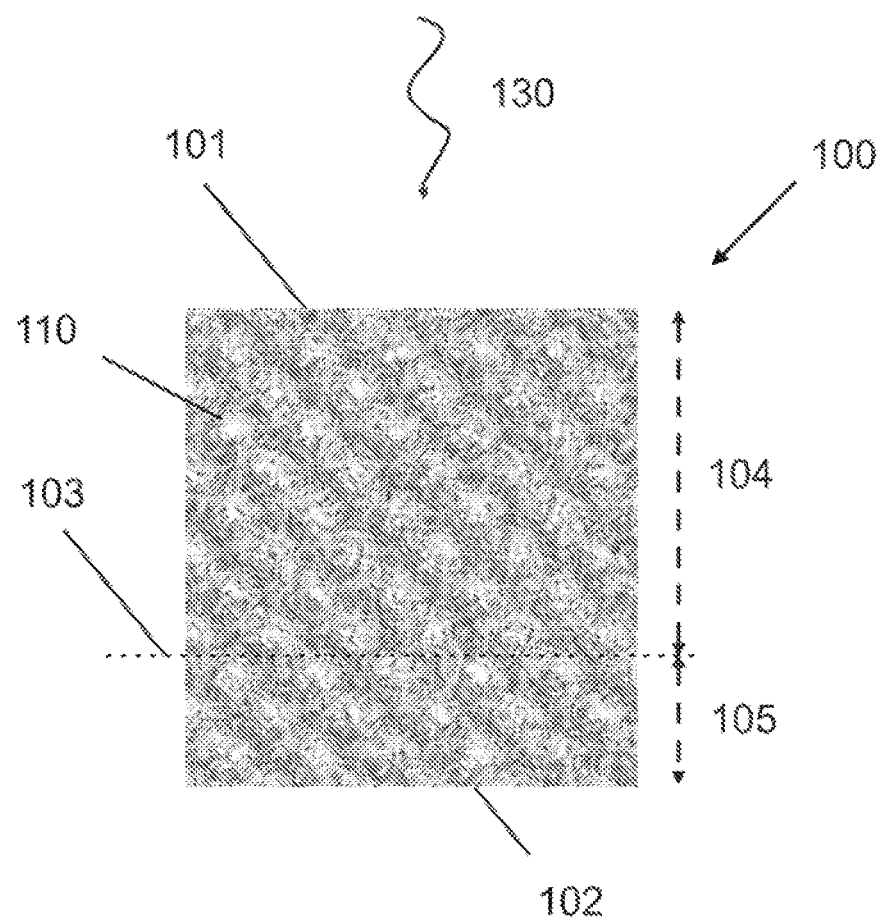
FIG. 1a illustrates an electromagnetic-wave absorber according to an embodiment in a cross-sectional view.

FIG. 1a illustrates an embodiment of an electromagnetic-wave absorber 100 in a cross-sectional view. The absorber 100 comprises a body of porous material 110 (hereinafter "the body") having a first surface 101. The first surface can be oriented towards incident electromagnetic radiation 130. It may be flat or substantially flat. The body 110 may be shaped in various ways, for example, it may have a rectangular shape or a cylindrical shape. The body 110 may also be shaped in accordance with a target to be protected. It may be fabricated in sheets of any size, with only the minimum size characterized by the wave length of the incident radiation 130. Consequently, the body 110 may have a diameter of, for example, 0.1-50 m or 0.1-5 m or 0.5-50 m in one or more directions across the surface 101. The thickness of the body 110 may be selected based on the application, for example based on the frequency range to be absorbed. It can also be made thin, for example having thickness of 3-8 mm or 3-6 mm. The thickness may be constant or substantially constant. The absorber 100 may be elastic material so that it may be bent to follow the surface of the target to be protected. For example, the absorber may be bent as a cylinder, so that the second surface 102 forms a circular shape, in which case it may be used to cover the outer surface of cylindrical objects.

The porous material may also be considered as cellular material, i.e. it has a cellular structure. The porous material comprises interstices through which liquid or air may pass, hereinafter referred to as "pores". It may be made of tubes or strands forming a web, which allows liquid or air to permeate the structure. The tubes or strands may be thinner than the pores. They may have a diameter of, for example, 10 nm-1 mm, 1 μm-300 μm or 1 μm-100 μm. The porous material may be a polymer material or a ceramic. It may also be a foam material, for example polymer foam or cellular polymer foam, providing the effects of these materials such as low weight, cushioning performance, thermal and acoustic insulation, impact dampening and cost reduction. A particular example is polyurethane-based foam. The porous material may also be, for example, based on polyester or polyether.

The body 110 comprises a first layer 104 comprising coating within the porous material. The first layer 104 may have constant or substantially constant thickness. The thickness may be equal or be smaller than the thickness of the body 110. The coating is applied in the cellular structure on the surface of the pores. Consequently, it forms a coating layer on top of the elements in the cellular structure, e.g. tubes or strands. When the cellular structure is formed by a web of tubes or strands, the coating is then applied on the surface of these tubes or strands. Within the first layer 104, the coating is applied on the surfaces of the pores facing the first surface 101. It may optionally be applied also on the other surfaces of the pores. The coating is of electrically conductive material so that it scatters the electromagnetic waves within the body. Particular details may be selected based on the application requirements, e.g. the wave length of the incident waves 130. The coating may be thin, for example of thickness 1 nm-0.1 mm.

The body 110 comprises a second surface 102 opposite to the first surface 101, i.e., on the other side of the body 110. The second surface may be flat or substantially flat. The first surface 101 and the second surface 102 may be parallel or substantially parallel. The second surface 102 may be directly contacted with a target to be protected by the absorber 100.

The first layer 104 of the body is coated starting from the first surface 101. The first layer may extend through the body 110 but the body 110 may also comprise a second layer 105 free of coating. In this case, the thickness of the first layer 104 becomes smaller than the thickness of the body 110. In an embodiment illustrated in FIG. 1, the body 110 is divided into these two layers 104, 105 so that it only consists of the two layers 104, 105 with no additional layers. This makes the absorber 100 particularly fast and resource-effective to manufacture as it contains a coated layer 104 for scattering electromagnetic waves 130 and a neutral layer 105 within the same body and the body is divided into the two layers. When adjacent to each other, the two layers 104, 105 are separated by an interface 103. The interface 103 may be flat or substantially flat. For example, variation in the thickness of the first layer 104 may be 1 mm or less. When a neutral layer is formed in the body 110 as a second layer 105, the absorber 100 may be provided as a monolithic body comprising both the scattering layer and the neutral layer.

Figure 1B:
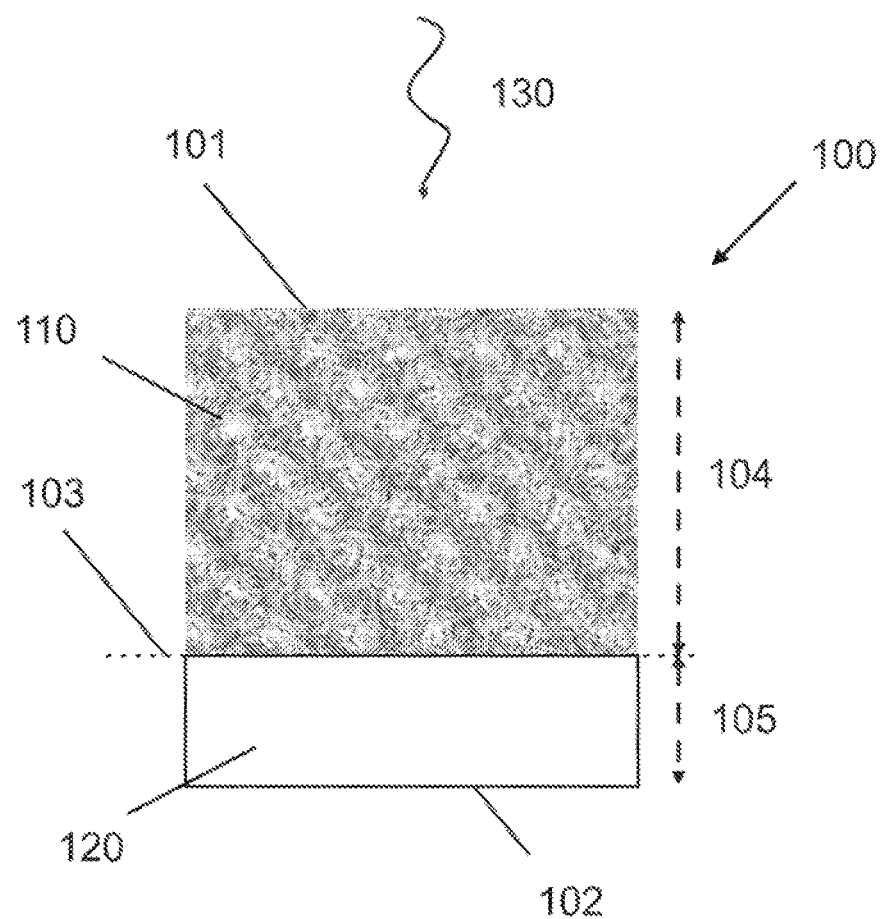
FIG. 1b illustrates an electromagnetic-wave absorber according to another embodiment in a cross-sectional view.

FIG. 1b illustrates another embodiment of an electromagnetic-wave absorber 100. In the embodiment, a second layer 105 is formed in a second body 120. The second layer 105 is material transparent to the electromagnetic waves 130 and it may be coupled to the first body 110 either removably or non-removably. Consequently, the features described above in relation to the second layer 105 also hold for the second body 120 and the difference between the two is that the second body is separate from the first body 110. The second body may therefore also be of different material than the body of porous material 110. The second body may be, for example, polymer foam or plastic. The second body 120 may also be formed in the target to be protected. The second body 120 comprises a second interface 102, which may be flat or substantially flat. As in the embodiment of FIG. 1a, the interface 103 between the first layer 104 and the second layer 105 may be flat or substantially flat also here.

Figure 2:
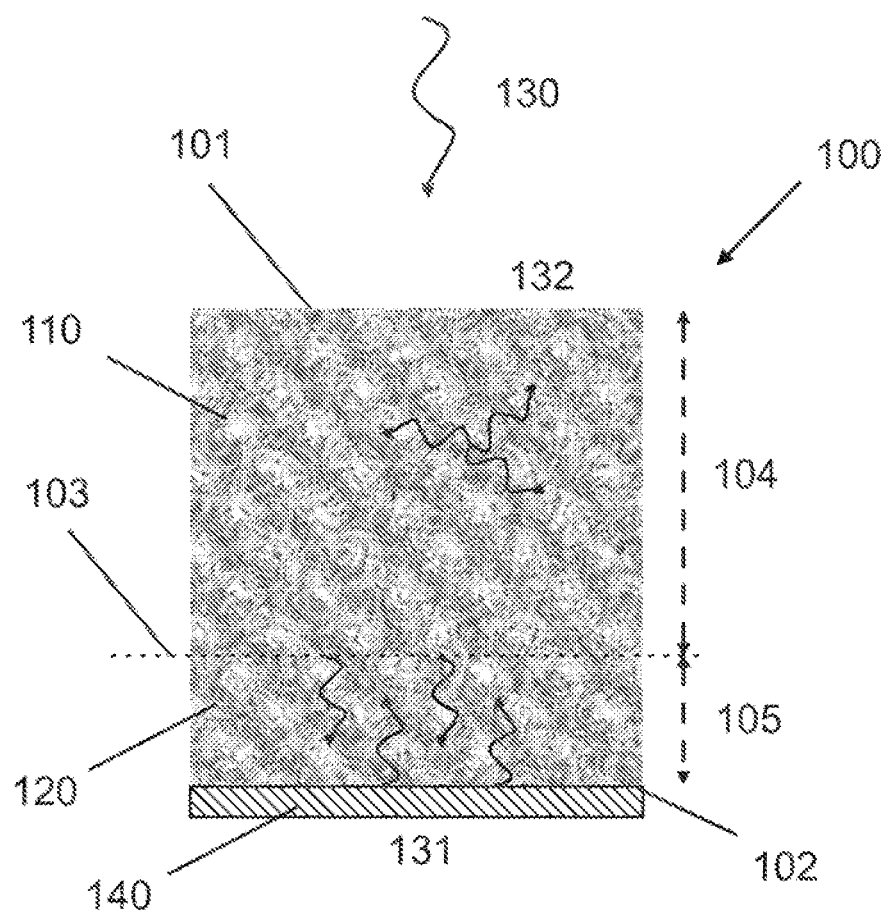
FIG. 2 illustrates an electromagnetic-wave absorber according to a further embodiment in a cross-sectional view.

FIG. 2 illustrates an embodiment of an electromagnetic-wave absorber 100 in a cross-sectional view. In the embodiment, the absorber 100 is either positioned on or comprises a reflective surface 140. It is to be understood that the second layer 102 in the embodiment may be part of the body of porous material 110 or it may be formed by a separate second body 120. The reflective surface 140 may be part of the target to be protected, for example the metallic surface of a vehicle or a missile. The reflective surface 140 may also be integrated in the absorber 100 for example by attaching it removably or non-removably to the second surface 102 of the body of porous material 110 or the second body 120.

The reflective surface 140 may be an outer surface of a body, the thickness of which body may be for example 1 nm-1 m. By using bodies such as films with small thickness, for example 1 nm-1 mm or 10 nm-100 μm, the absorber may be made compact and light-weighted.

Due to the reflective surface 140, electromagnetic waves 130 incident on the absorber 100 do not reach the target but reflect at the surface 140. Also their reflection from the absorber 100 becomes reduced due to the reflective coating in the first layer 104 which causes both backscattering 131 into the second layer and chaotic scattering 132 in the first layer 104. These processes may, in turn, give rise to destructive interference, resistive dissipation and/or capacitive impedance in the cellular structure.

Figure 3:
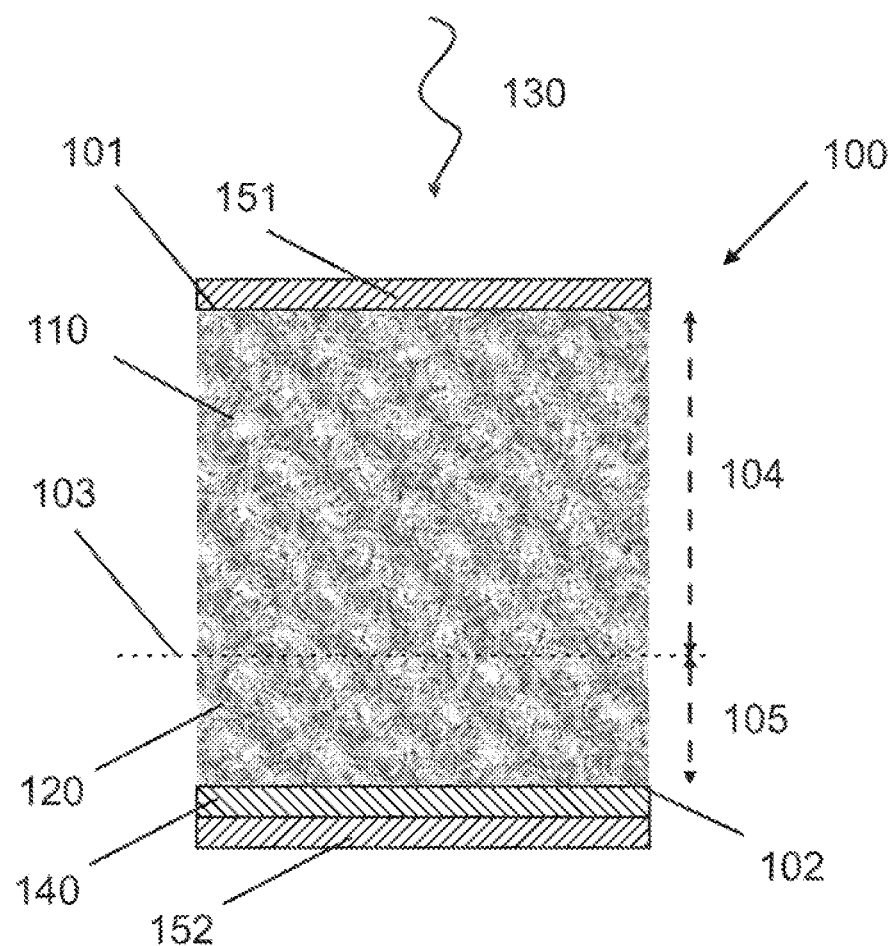
FIG. 3 illustrates an electromagnetic-wave absorber according to a yet further embodiment in a cross-sectional view.

FIG. 3 illustrates an embodiment of an electromagnetic-wave absorber 100 in a cross-sectional view. In the embodiment, the absorber 100 comprises one or more bodies 151, 152 that are transparent or substantially transparent to the electromagnetic waves 130. The one or more bodies 151, 152 may form a cover for the absorber 100 to provide at least one of holding the absorber 100 together, protecting it from wear and producing visual camouflage. For the last effect, the one or more bodies 151, 152 may comprise texture patterns or surface structure. They may also be cockled. The one or more bodies 151, 152 may be, for example, textiles or coated fabrics.

It is also possible to cover the body 110 of the absorber by a congealing or solidifying substance which simultaneously attaches it to the target, in which case the substance forms the covering body 151. The substance may also be adhesive. Such a cover may be applied directly on the target, for example by spraying, so that it may be enough to cover only the first surface 101 with a body 151 formed by the substance, whereas the second surface 102 may be either directly placed on the target or, if necessary, a reflective surface 140 may be placed in between. However, due to the covering substance 151 attaching the absorber 100 to the target and holding it together, there may not be need for an additional body 152 covering the back side of the absorber 100. When the substance is adhesive, no other fastening means are required. The substance may be, for example, a polymeric substance such as plastic or polyurethane. Thickness of the covering body 151 may be, for example, 0.1 mm-1 cm.

Figure 4:
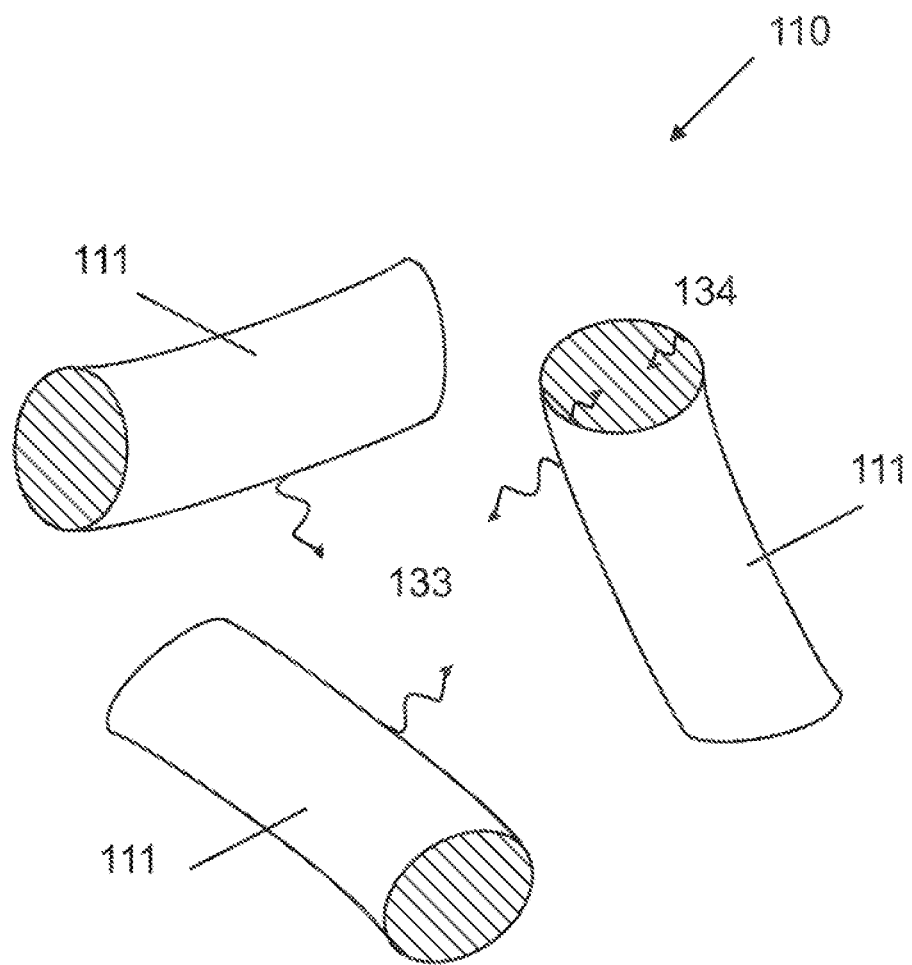
FIG. 4 illustrates an inner structure of a body of an electromagnetic-wave absorber according to an embodiment.

FIG. 4 illustrates an inner structure of the body 110 of an electromagnetic-wave absorber 100 according to an embodiment. The porous material comprises or consists of tubes or strands 111. Consequently, when the tubes or strands 111 comprise a reflective coating, electromagnetic waves may be scattered from their outer surface 133. It is noted that scattering may also take place within 134 the tubes or strands 111. As the tubes or strands 111 form conductive paths within the body 110, additional electromagnetic effects may also take place within the body 110, increasing energy dissipation and reducing reflection.

FIG. 5 further illustrates an inner structure 160 of the body 110 of an electromagnetic-wave absorber 100 according to an embodiment. The inner structure 160 described may be any part of the body 110 within the first layer 104. For example, it may be a pore or a cross-section of a tube or strand 111. Even though the illustrated structure 160 resembles a circle, it should be understood only as a general description of a structure within the body 110. For example, as pores may be formed as a web of threads and while such web-like structure often naturally assumes circular shapes, a cross-section of a pore may not necessarily always directly resemble a round circle. The illustration is rather presented to show how the present disclosure provides a method for selectively coating the body of porous material 110. When a coating 161 is applied on the structure 160 on a side facing the incident radiation 130 and a region free of coating 162 is formed on the opposite side, a preferential direction is induced in the body 110. Due to this break of symmetry, pockets are formed within the body 110 which emphasize scattering away 135 from the incident radiation direction 130. Consequently, the backscattering 131 from the neutral layer may be, on average, directed back towards the neutral layer.

FIG. 6 illustrates a method according to an embodiment. The method provides an electromagnetic-wave absorber 100. In the method 601, pores within a body of porous material 110 are coated with electrically conductive material to form a first layer 104 within the body 110 for scattering electromagnetic waves. By coating pores, plurality of randomly oriented scattering surfaces are formed so that the body 110 may function as an absorber, as described hereinabove, when positioned on a target.

Depending on the construction of the target, i.e. whether it comprises a reflective surface 140 or a layer 105 transparent to the electromagnetic waves on top of a reflective surface 140, the absorber 100 may be further modified to allow it to be used on other types of targets as well. In the method 602, the body 110 is coupled to a reflective surface 140 so that between the first layer 104 and the reflective surface 140, a layer 105 transparent or substantially transparent to the electromagnetic waves is formed. This layer may be formed in at least one of the following: the body 110, the target and an additional body 120 coupled to the absorber 100. Depending of the target to be protected, the absorber 100 may therefore be manufactured as any of the following: an absorber 100 comprising the body 110 with a coated layer 104, an absorber 100 comprising the body 110 with a coated layer 104 and a neutral layer 105, located within the body 110 or as a separate layer 120, or an absorber 100 comprising the body 110 with a coated layer 104, a neutral layer 105 located within the body 110 or as a separate layer 120, and a reflective surface 140. Any of these absorber 100 assemblies may be covered by one or more bodies 151, 152, such as textiles for protection and/or visual camouflage. The method may comprise packaging the absorber 100 so that it comprises at least the body 110 of porous material and, optionally, at least one of a reflective surface 140 and a cover 151, 152.

The coating may be performed by dipping or drenching the body 110 in electrically conductive material, for example in an electrically conductive fluid. The thickness of the coated layer 104 may be controlled by the dipping or drenching depth. The coating may also be performed by spraying or squirting a first surface of the body 110 with electrically conductive material, for example in an electrically conductive fluid. The spraying or squirting is performed so that the electrically conductive material penetrates a first layer 104 of the body 110. This allows the coating to be selectively applied from one direction, creating directed coating within the body, for example as explained in relation to FIG. 5. In this case, the parameters of the coated layer 104 such as the thickness may be controlled by at least one of pressure, angular spread or exposure time of the spraying or squirting. In both of the above cases, i.e. complete and selective coating, the coating may be performed automatically. For example, a robot such as an industrial robot may be programmed and used to perform the coating.

Finally, the absorber 100 may be coupled 603 to the target, for example by coupling the body 110 to target directly or through a second body 120. This may be performed removably or non-removably. For example, adhesive or one or more fastening elements may be used. The coupling may not always be necessary, for example when the absorber 100 is manufactured as a large or self-supporting interface, or when the absorber is manufactured as an absorbing wall. The absorber 100 may also be attached to a target by covering it with a congealing or solidifying substance such as a polymer, for example plastic or polyurethane. Such a cover may be sprayed on top of the absorber 100. When the substance is adhesive, no other fastening means are required. In addition to fastening, the substance may be used to stiffen the absorber structure.

It is to be understood that the method as described above may be used in providing any type of absorber as described above. It is also to be understood that the method may comprise any number of steps for arranging the absorber 100 as described hereinabove. Also the following alternatives may be applied both in relation to the absorber and the method.

In an embodiment, the reflective surface 140 is metallic. It may be part of a metal body. The metal may be, for example, aluminum. The metal body may be a metallic film, e.g. an aluminum film.

Porous material is a material containing pores. The pores may have sizes ranging from a nanometer to several millimeters. The true volume of the material is defined as the volume of the solid network, i.e., excluding pores and voids. The apparent volume of the material is defined as the volume of the material including closed or inaccessible pores. The bulk volume of the material is defined as the volume including pores and voids, i.e. the total volume of the solid network, closed pores and open pores. Porosity is defined as the ratio of the total volume of the pores to the apparent volume. The arrangement of pores may be irregular. The pores are interconnected. The material may be foam-like. The material may consist of a network of tubes or strands, i.e. it may a have a meshed structure. The porous material may be non-conductive, i.e. a dielectric.

In an embodiment the porous material comprises pores larger than 50 nm and/or smaller than 5 mm. In an embodiment, the porous material is open-porous material. The body of porous material may have a porosity of at least 50 percent or at least 80 percent. In an embodiment the body of porous material has a porosity of at least 90 percent. The porosity may also be, for example, 95-99.9 percent, 96-98 percent or 96.5-97.5 percent. The body of porous material may have 1-100 pores per inch (PPI). In an embodiment the body of porous material has 15-60 PPI. The body of porous material may also have 20-40 PPI or 25-35 PPI.

In an embodiment the coating only partially covers the pores so that a region with coating is formed on the side of the pores facing the first surface and a region free of coating is formed on the side of the pores facing away from the first surface. The region with coating may cover at least 50 percent of the diameter of the pores. In particular cases, it may cover 75-90 percent of the pores.

The thickness of the first layer may be 50-95 percent of the combined thickness of the first layer and the second layer. In an embodiment, the thickness of the first layer is 70-85 percent of the combined thickness of the first layer and the second layer. The thickness of the first layer may also be 70-80 percent or 72-78 percent of the combined thickness. The combined thickness may be the total thickness of the body of porous material when exactly two layers are formed in the body.

In an embodiment the electrically conductive material is metal, metal alloy, metal silicate or carbon-based material. The material may be, for example, copper-silver, aluminum or zinc silicate.

In an embodiment the absorber comprises a cover of material substantially transparent to the electromagnetic waves covering at least the first surface. The cover may be, for example, of polypropylene.

FIGS. 7a-b illustrate measurement results related to an electromagnetic-wave absorber according to an embodiment. The frequency range for incident electromagnetic waves in the measurements is 9-13 GHz. FIG. 7a illustrates reflection and transmission measurements and FIG. 7b illustrates measurements for absorbed power. The particular embodiment comprises a body of porous material 110 having a coated layer 104 and a neutral layer 105 within. In addition, the embodiment comprises a reflective surface 140 as a metallic film. Reflection is measured for incident waves coming from two opposite directions: one facing the first surface 101 (S1) and one facing the second surface (S2). Further measurements have been performed (not shown), for example, in the frequency ranges of 1-22 GHz (radar), 25-38 GHz (thermal imaging), 188-375 GHz (laser range finding) and 330-600 GHZ (night vision). The absorber 100 may be used at any of these frequency ranges or for the range 1-600 GHz. By adjusting the material parameters, for example as described above, the frequency ranges may be adjusted.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

Any embodiment may be combined with another embodiment unless explicitly disallowed. It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

The term 'comprising' is used herein to mean including the method, blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. An electromagnetic-wave absorber comprising a body of porous material; the body of porous material comprising
  a first surface for receiving electromagnetic waves, and starting from the first surface, a first layer for scattering the electromagnetic waves, in which layer pores comprise a coating of electrically conductive material;
  wherein the electromagnetic-wave absorber comprises, positioned after the first layer, a second layer substantially transparent to the electromagnetic waves and, positioned after the second layer, a reflective surface for reflecting the electromagnetic waves, wherein the reflective surface is a metallic film; and
  wherein the porous material is open-porous material, and the coating only partially covers the pores so that a region with coating is formed on the side of the pores facing the first surface and a region free of coating is formed on the side of the pores facing away from the first surface inducing a preferential direction in the body.

2. The electromagnetic-wave absorber of claim 1, wherein the second layer is formed in the body of porous material.

3. The electromagnetic-wave absorber of claim 1, wherein the porous material has a porosity of at least 90 percent.

4. The electromagnetic-wave absorber of claim 1, wherein the porous material has 15-60 pores per inch (PPI).

5. The electromagnetic-wave absorber of claim 1, wherein the thickness of the first layer is 70-85 percent of the combined thickness of the first layer and the second layer.

6. The electromagnetic-wave absorber of claim 1, wherein the electrically conductive material is metal, metal alloy or carbon-based material.

7. The electromagnetic-wave absorber of claim 1, comprising a cover of material substantially transparent to the electromagnetic waves covering at least the first surface.

8. A method comprising:
coating pores within a body of porous material with electrically conductive material to form a first layer within the body for scattering electromagnetic waves; and
coupling the body to a reflective surface so that between the first layer and the reflective surface, a second layer substantially transparent to the electromagnetic waves is formed;
wherein the reflective surface is a metallic film, the porous material is open-porous material, the body of porous material comprises a first surface for receiving electromagnetic waves and the coating only partially covers the pores so that a region with coating is formed on the side of the pores facing the first surface and a region free of coating is formed on the side of the pores facing away from the first surface inducing a preferential direction in the body.

9. The method according to claim 8, wherein the coating of the pores is performed by spraying or squirting a first surface of the body with electrically conductive material.

10. The method according to claim 8, comprising attaching the body to a target by covering it with a congealing or solidifying substance.

* * * * *